(12) United States Patent
Poh Ho et al.

(10) Patent No.: US 6,771,097 B1
(45) Date of Patent: Aug. 3, 2004

(54) SERIES TERMINATED CMOS OUTPUT DRIVER WITH IMPEDANCE CALIBRATION

(75) Inventors: David Seng Poh Ho, Singapore (SG); Wee Teck Lee, Singapore (SG)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 10/419,886

(22) Filed: Apr. 22, 2003

(51) Int. Cl.$^7$ .............................. H03B 1/00; H03K 3/00

(52) U.S. Cl. ........................ 327/108; 327/112; 326/30; 326/86; 326/87

(58) Field of Search ................................. 327/108, 110, 327/112; 326/27, 30, 82, 83, 86, 87, 89, 90, 91

(56) References Cited

U.S. PATENT DOCUMENTS

| | | | | |
|---|---|---|---|---|
| 4,992,676 A | * | 2/1991 | Gerosa et al. | 326/27 |
| 5,450,019 A | * | 9/1995 | McClure et al. | 326/28 |
| 5,739,707 A | * | 4/1998 | Barraclough | 327/112 |
| 6,133,749 A | * | 10/2000 | Hansen et al. | 326/30 |
| 6,201,405 B1 | * | 3/2001 | Hedberg | 326/30 |
| 6,204,692 B1 | * | 3/2001 | Nakagawa | 326/83 |

OTHER PUBLICATIONS

Gabara, Thadeus J. et al., "*Digitally Adjustable Resistors in CMOS for High–Performance Applications,*" IEEE Journal of Solid–State Circuits, vol. 27, No. 8, Aug. 1992.

* cited by examiner

*Primary Examiner*—Tuan T. Lam
(74) *Attorney, Agent, or Firm*—Sterne, Kessler, Goldstein & Fox, PLLC

(57) ABSTRACT

A differential line driver includes a plurality of driver cells. Control logic outputs positive and negative control signals to the driver cells so as to match a combined output impedance of the driver cells at (Vop, Von). Each driver cell includes an input Vip and an input Vin, an output Vop and an output Von, a first PMOS transistor and a first NMOS transistor having gates driven by the input Vip, and a second PMOS transistor and a second NMOS transistor having gates driven by the input Vin. A source of the first PMOS transistor is connected to a source of the second PMOS transistor. A source of the first NMOS transistor is connected to a source of the second NMOS transistor. First and second resistors are connected in series between the first PMOS transistor and the first NMOS transistor, and connected together at Von. Third and fourth resistors are connected in series between the second PMOS transistor and the second NMOS transistor, and connected together at Vop. A first output switch is driven by a corresponding positive control signal and connected between a supply voltage and the sources of the first and second PMOS transistors. A second output switch driven by a corresponding negative control signal and connected between a ground and the sources of the first and second PMOS transistors.

26 Claims, 9 Drawing Sheets

NMOS branch calibration 1) startcal asserted - calibration start
2) Reset Nn = 32.
3) ncycle = 1; avgn[ncycle] = Nn;
4) Turn on Nn NMOS branches
5) If voutn > VR2
   Nn = Nn + 1
   else Nn = Nn - 1
6) avgn[ncycle] = avgn[ncycle] + Nn
7) Repeat steps 4) to 6) 8 times
8) ncycle = ncycle +1
9) If ncycle > 3 then
   If avgn[ncycle]/8==avgn[ncycle-1]/8 OR (ncycle==15)
      caldonen = true
      calnvalue = avgn[ncycle-1]/8
      (ie. Calibration for N branch complete
      NMOS branch calibration value = calnvalue)
   else goto step 4)
else goto step 4)

PMOS branch calibration 1) startcal asserted - calibration start
2) Reset Np = 32.
3) pcycle = 1; avgp[pycle] = Nn;
4) Turn on Np PMOS branches
5) If voutp > VR1
   Np = Np - 1
   else Np = Np + 1
6) avgp[pcycle] = avgp[pcycle] + Np
7) Repeat steps 4) to 6) 8 times
8) pcycle = pcycle + 1
9) If pcycle > 3 then
   If avgp[pcycle]==avgp[pcycle-1] OR (pcycle==15)
      caldonep = true
      calpvalue = avgp[pcycle-1]/8
      (ie. Calibration for P branch complete
      PMOS branch calibration value = calpvalue)
   else goto step 4)
else goto step 4)

10) If caldonen==true AND caldonep==true
    stop calibration clock
    assert calfin signal (to signal to ASIC calibration finished)

SERIES TERMINATED CMOS OUTPUT DRIVER WITH IMPEDANCE CALIBRATION

BACKGROUND OF THE INVENTION

1. Field of the Invention

The present invention relates to line drivers, and more particularly, to differential line drivers with impedance that is matched to the line.

2. Description of the Related Art

In high speed signaling systems, drivers with output impedance matched to the line impedance are used. A conventional voltage mode series terminated driver can be realized using an inverter with proper sizing of the NMOS and PMOS transistors to give an output impedance equal to the line impedance, which is typically 50 ohms. A circuit implementation of such a driver 100 in its differential form is shown in FIG. 1.

Referring to FIG. 1, PMOS transistors MP1, MP2 and NMOS transistors MN1, MN2 are sized to give a nominal output impedance of 50 ohms to drive a 50 ohm line. To avoid excessive reflections of reverse travelling waves caused by mismatched far end terminations or discontinuities requires that the output impedance of the transmit driver be closely matched to the characteristic impedance of the line, typically within 10% or better. However, the turn-on resistance of the NMOS or PMOS transistors may vary by 50% or more across process, supply voltage and temperature variations.

The driver 100 of FIG. 1 can be improved if the output impedance is made up of the sum of the resistance of a transistor switch and a resistor R1 as shown in FIG. 2.

The output impedance of the driver 200 of FIG. 2 can be made to be dominated by the resistor R1, especially since the variation of a resistor across process, voltage and temperature variation is usually much less than that of a transistor. However, the variation is often still in the order of 20 to 30%. Achieving adequate output impedance matching requires some form of calibration or compensation mechanism. As shown in FIG. 3 and FIG. 4, this can be done by digitally trimming the resistance value if the driver 100 of FIG. 1 or the driver 200 of FIG. 2 is replaced by a segmented driver where segments are switched in or out by control lines ctlp0 . . . ctlpi and ctln0 . . . ctlni to match the output impedance of the driver to the impedance of the line as closely as possible.

FIG. 3 shows a segmented driver using the driver cell structure 100 of FIG. 1, and FIG. 4 shows a segmented driver using the driver cell structure 200 of FIG. 2. Referring to FIG. 3 each segment of the driver is enabled only if ctlpi and ctlni is asserted high. For example if ctlp1 and ctln1 are asserted high, then transistors MP1 and MN1 are enabled to invert the input signal Vip. This corresponds to reducing the output impedance, since the turn-on resistances of MP1 and MN1 are added in parallel with the existing driver total output impedance.

The control lines ctlp and ctln are usually driven by a feedback control circuit that compares the output impedance of a replica output driver with that of an external reference resistor. After each comparison, a finite state machine uses the control lines ctlp and ctln to turn on or off driver segments to adjust the total driver output impedance to match and track the impedance of an external reference resistor.

There are several drawbacks to the driver structure of FIG. 4. The signal (Vip, Vin) and control (ctlp, ctln) shares the same logic path through the logic gates. The logic gates in each driver segment introduce additional delay mismatches between the PMOS and NMOS transistor inputs, since the logic required to turn off an NMOS transistor is different from that for a PMOS transistor. This has the effect of shifting signal transitions away from the desired voltage point. Even if the logic were to be made similar, the loading for the output of the logic circuits would be different, since typically PMOS transistors are larger than NMOS transistors, and this can cause additional delay variation and mismatches.

Also, during the midlevel transition of the driver input voltage Vip, both PMOS and NMOS transistors can be turned on. This causes a large transient shoot through current given by $V_{DD}$/(Resistance of PMOS transistor+Resistance of NMOS transistor) at that instant.

A calibration circuit that can be used to calibrate the segmented driver is shown in FIG. 5. (Note that FIG. 5 shows the one half of the circuit required to perform impedance calibration for the segmented driver of FIG. 4.) The circuit in FIG. 5 uses a replica of the PMOS side of the segmented driver (see William J. Dally and John W. Poulton, "Digital Systems Engineering" Cambridge University Press, pp. 519–521).

The principle of operation of the circuit of FIG. 5 is as follows: an external resistor $R_{EXT}$ and a current source 501 is used to generate a voltage reference at node V1. A matched current source 502 sinks current from the PMOS side of a replica segmented driver. The voltage drop across the PMOS side output impedance will determine the voltage at V2. The state machine will then turn on each driver segment by asserting ctlp0 to ctlpi. As each segment is turned on, the voltage at V2 is compared to that at V1. When a transition is detected, this indicates that the voltage at V1 is nearly equal to that of V1. The output resistance of the PMOS side is thus matched to that of the external resistor $R_{EXT}$.

This approach also has a number of disadvantages. Two sets of the same calibration circuitry consisting of the current sources, comparator, state machine logic are needed to calibrate both the PMOS and NMOS sides of the driver. Also, two external resistors $R_{EXT}$ and extra pads are required. Furthermore, for any transistors that are connected to a pad directly or through a resistor, special layout rules for ESD (electrostatic discharge) protection are necessary. The special layout rules cause the actual transistor layout to be much larger (4× to 10×) than without the ESD rules. Referring to FIG. 5, transistors MP0 . . . MPi, as well as the transistors used to create the matched current sources 501, 502, need to have special ESD layout. Additionally, if matched current sources 501, 502 and a reference resistor $R_{EXT}$ with the same impedance as the output driver are used, then the reference current source needs the same amount of current as the current that flows through the 50 ohm output driver. This current is significant, and is an inefficient use of available current. Alternatively, the reference current source can be made smaller and the reference resistor larger, but this introduces greater matching and scaling errors.

A similar scheme is mentioned in T. Gabara and S. Knauer, "Digitally Adjustable Resistors in CMOS for High Performance Applications" *IEEE Journal of Solid State Circuits*, Vol. 27, No. 8, August 1992, pp. 1176–1185, which uses as the first branch an external reference resistor in series with a bottom half of a replica driver to perform calibration. Another branch consists of the other upper half of a replica driver using another replica of the calibrated bottom half as the reference resistor. This requires extra area, since it requires three half replicas that include two bottom halves and one upper half, as well as extra power in each of the two series branches.

Accordingly, what is needed is a line driver that consumes low current and whose output impedance is closely matched to that of the transmission line.

SUMMARY OF THE INVENTION

The present invention is directed to a series terminated CMOS output driver with impedance calibration that substantially obviates one or more of the problems and disadvantages of the related art.

There is provided a differential line driver including a plurality of driver cells. Control logic outputs positive and negative control signals to the driver cells so as to match a combined output impedance of the driver cells at (Vop, Von). Each driver cell includes an input Vip and an input Vin, an output Vop and an output Von, a first PMOS transistor and a first NMOS transistor having gates driven by the input Vip, and a second PMOS transistor and a second NMOS transistor having gates driven by the input Vin. A source of the first PMOS transistor is connected to a source of the second PMOS transistor. A source of the first NMOS transistor is connected to a source of the second NMOS transistor. First and second resistors are connected in series between the first PMOS transistor and the first NMOS transistor, and connected together at Von. Third and fourth resistors are connected in series between the second PMOS transistor and the second NMOS transistor, and connected together at Vop. A first output switch is driven by a corresponding positive control signal and connected between a supply voltage and the sources of the first and second PMOS transistors. A second output switch driven by a corresponding negative control signal and connected between a ground and the sources of the first and second PMOS transistors.

In another aspect there is provided a differential line driver including a plurality of driver cells. A feedback loop controls the driver cells with selective positive and negative control signals to selected driver cells so as to match a combined output impedance of the driver cells. Each driver cell includes a positive input and a negative input, a positive output and a negative output. A first PMOS transistor and a first NMOS transistor have gates driven by the positive input. A second PMOS transistor and a second NMOS transistor have gates driven by the negative input. A source of the first PMOS transistor is connected to a source of the second PMOS transistor. A source of the first NMOS transistor is connected to a source of the second NMOS transistor. First and second resistors are connected in series between the first PMOS transistor and the first NMOS transistor, and connected together at the negative output. Third and fourth resistors are connected in series between the second PMOS transistor and the second NMOS transistor, and connected together at the positive output. A first output switch is driven by a corresponding positive control signal and connected between a supply voltage and the sources of the first and second PMOS transistors. A second output switch is driven by a corresponding negative control signal and connected between a ground and the sources of the first and second PMOS transistors.

In another aspect there is provided a differential line driver including a first plurality of parallel driver circuits receiving a positive input and outputting a negative output. Each driver circuit comprises, in series between a supply voltage and a ground: a first switch driven by a corresponding positive control signal, a first PMOS transistor whose gate is driven by the positive input, a first resistor, a second resistor, a first NMOS transistor whose gate is driven by the positive input, and a second switch driven by a corresponding negative control signal. The negative output is generated between the first and second resistors. A second plurality of parallel driver circuits input a negative input and output a positive output. Each driver circuit comprises, in series between the first switch and the second switch: a second PMOS transistor whose gate is driven by the negative input, a third resistor, a fourth resistor, and a second NMOS transistor whose gate is driven by the negative input. The positive output is generated between the first and second resistors. Control logic generates the positive and negative control signals so as to match a combined output impedance of the differential line driver to a line.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS.

The accompanying drawings, which are included to provide a further understanding of the exemplary embodiments of the invention and are incorporated in and constitute a part of this specification, illustrate embodiments of the invention and together with the description serve to explain the principles of the invention. In the drawings:

FIG. 9 illustrates the calibration process used in the driver of FIGS. 7 and 8.

DETAILED DESCRIPTION OF THE INVENTION

Reference will now be made in detail to the embodiments of the present invention, examples of which are illustrated in the accompanying drawings.

Figure 2:
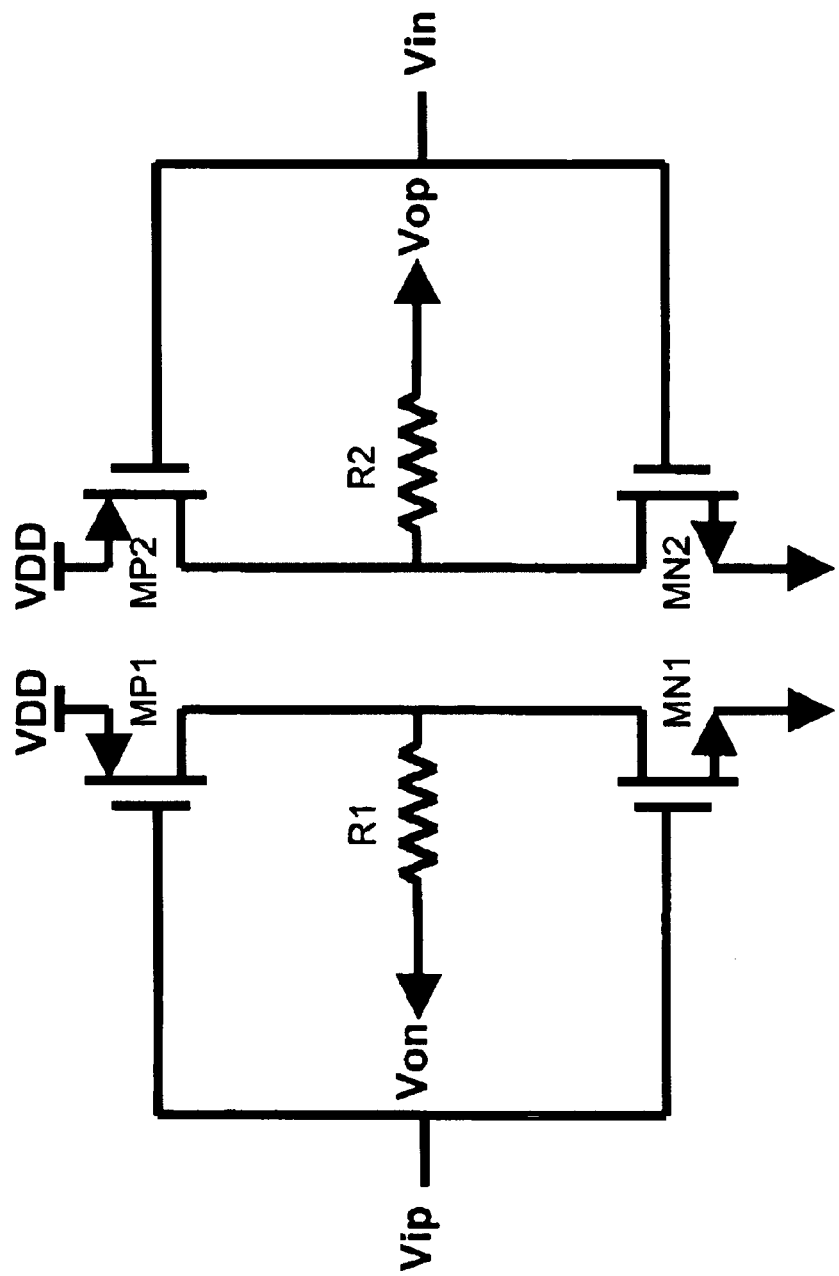
FIG. 2 shows a modified conventional differential line driver cell.
Figure 3:
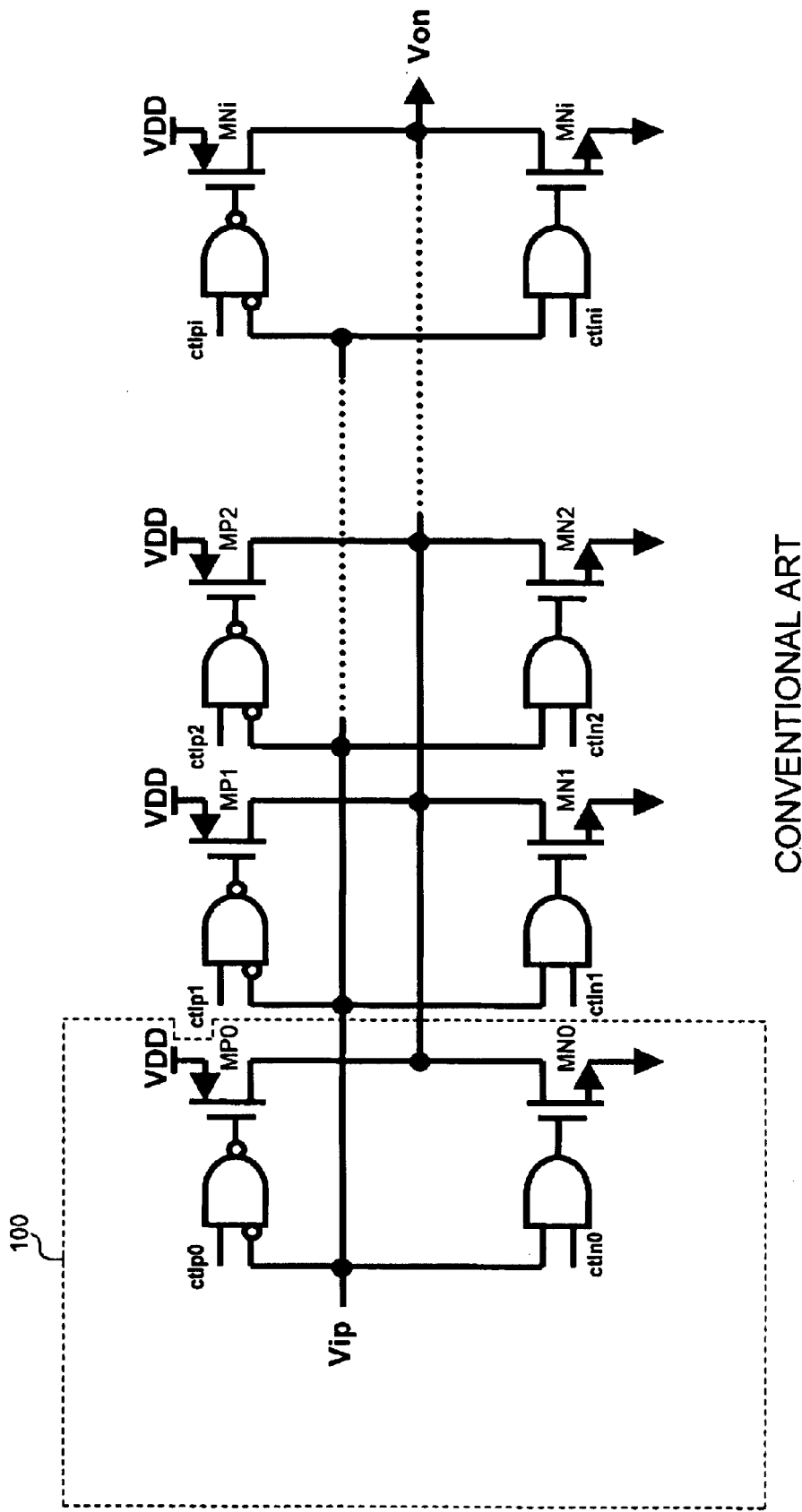
FIG. 3 shows a plurality of conventional driver cells of FIG. 1 arranged in parallel.
Figure 4:
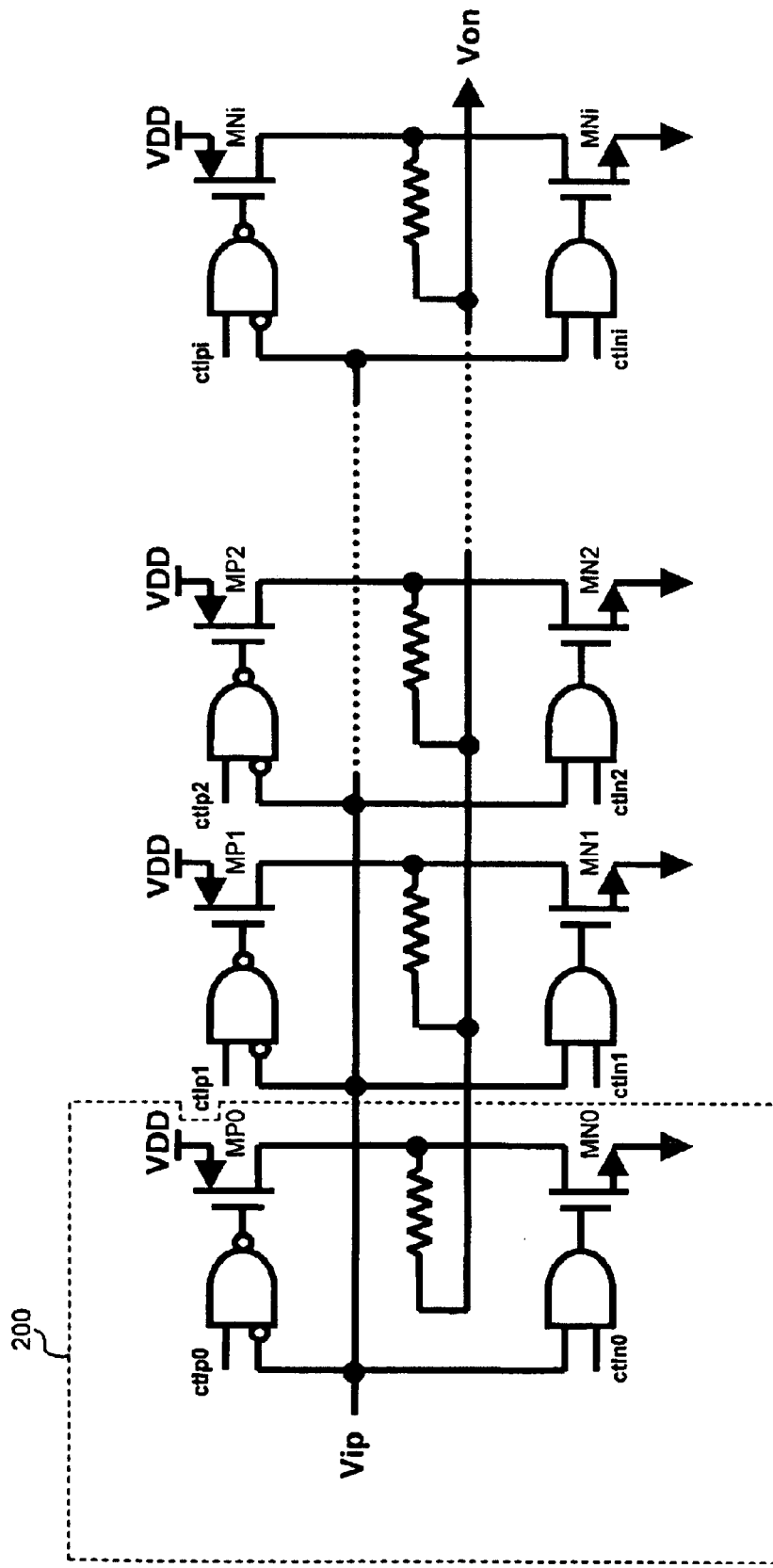
FIG. 4 shows a plurality of conventional driver cells of FIG. 2 arranged in parallel.
Figure 5:
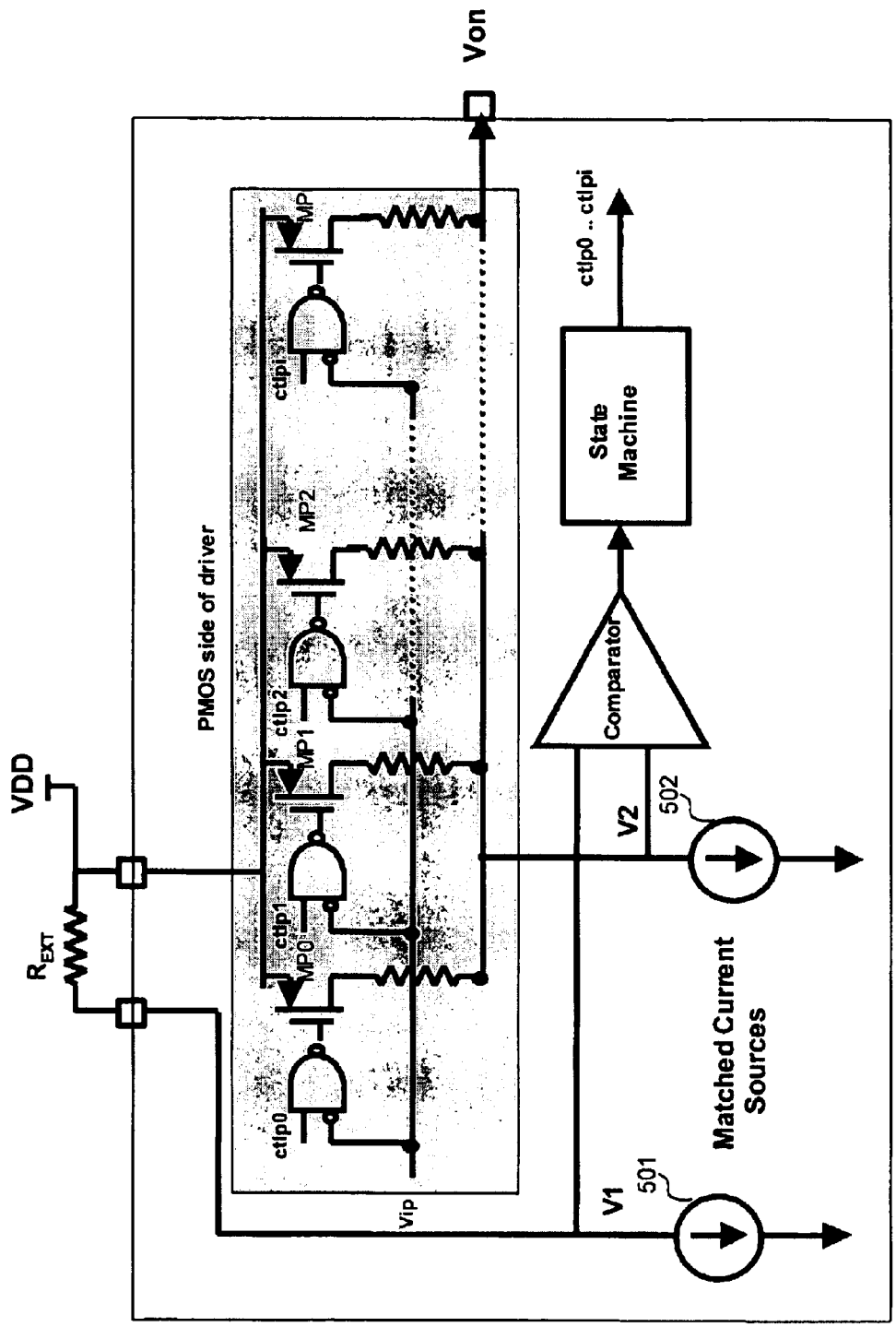
FIG. 5 shows a conventional differential line driver calibration circuit.

The proposed invention overcomes the disadvantages outlined for both the driver structure of FIG. 2, the segmented structure of FIG. 4, its associated calibration circuitry of FIG. 5 and the similar scheme described in Gabara et al.

Figure 1:
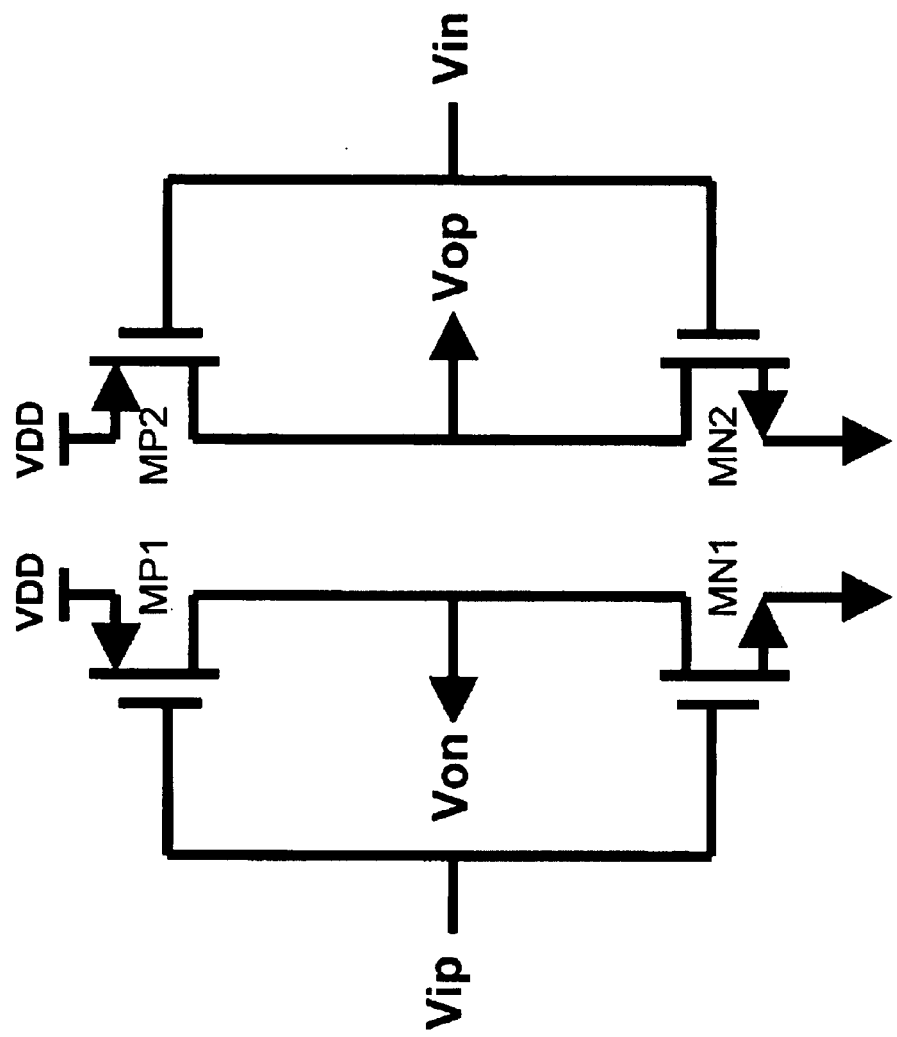
FIG. 1 shows a conventional differential line driver cell.

The output impedance of prior art inverter type drivers as shown in FIG. 1 changes significantly with the output voltage. For the present invention, if the resistors and transistors are sized such that the resistors provide the dominant termination impedance, then the output impedance of the driver will vary insignificantly with respect to the output voltage.

Conventional inverter drivers share the same signal and control path. In the present invention, the signal path and control path are separated, allowing the removal of any control logic in the signal path.

The transient shoot through current is reduced compared to the conventional inverter type series termination type drivers.

An output series terminated segmented driver cell structure and its associated impedance calibration method and circuitry is described below.

An output driver normally includes a number N of driver cells, or segments. The number of driver cells switched on (or enabled) is determined by the impedance calibration circuitry. In one example, the calibration circuitry can use comparators, a state machine and feedback loop to switch on or off the required number of driver cells, to match and track the impedance of an external resistor.

Figure 6:
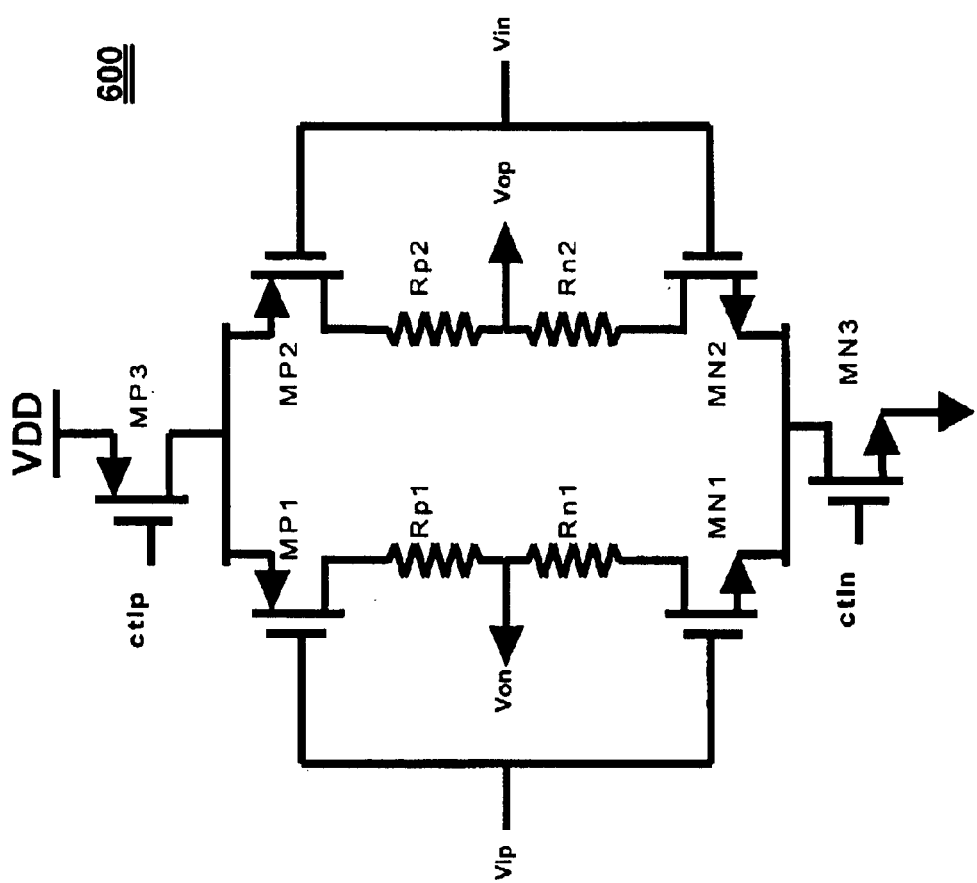
FIG. 6 shows a differential line driver cell of the present invention.

FIG. 6 shows a diagram of a single driver cell 600. Referring to FIG. 6, the driver cell 600 that is enabled by ctlp and ctln that control series PMOS and NMOS switches is shown. As shown in FIG. 6, the differential line driver cell 600 of the present invention includes a switch, for example, a PMOS transistor MP3 driven by a control signal ctlp. The transistor MP3 is connected to sources of two PMOS transistors MP1 and MP2. Drains of the transistors MP1 and MP2 are connected to resistors RP1 and RP2, respectively, which are in turn connected to resistors RN1 and RN2, respectively. The transistors RN1 and RN2 are connected to two NMOS transistors MN1 and MN2, whose sources are tied together and to a second switch (for example, an NMOS transistor NM3) that is controlled by a negative control signal ctln.

Figure 7:
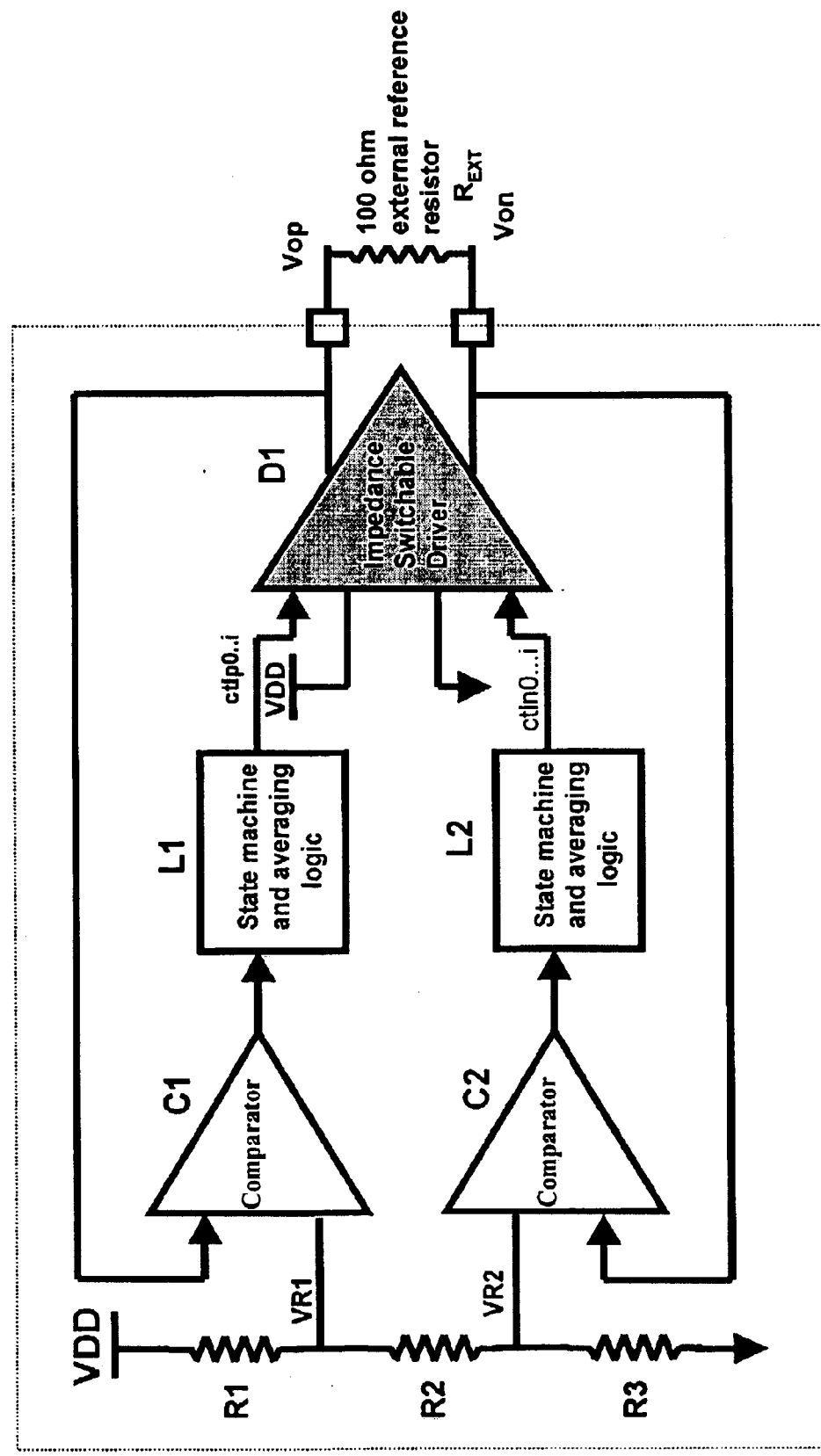
FIG. 7 shows a calibration circuit for the differential line driver cell of the present invention.

FIG. 7 shows a diagram of the calibration circuit of the present invention. As shown in FIG. 7, an impedance switchable driver D1 typically comprises a plurality of driver cells 600, one of which is illustrated in FIG. 6. The PMOS side and the NMOS side both have their own calibration feedback loops. One of the feedback loops includes a comparator C1, and a state machine L1 that outputs control signals ctlp0 ... ctlpi. Similarly, the NMOS branch includes a comparator C2 and a state machine L2 that outputs the control signals ctln0 ... ctlni. A reference ladder may be used to generate reference voltages VR1 and VR2 for use by the comparators C1 and C2. The circuit is therefore essentially a dual closed loop system that forces Vop to track VR1 and Von to track VR2. When Vop is equal to VR1 and Von is equal to VR2 then the driver output impedance will be 50 ohms on each side.

When ctlp is asserted low to 0 volts and ctln is asserted high to the supply voltage, the driver cell 600 of FIG. 6 is enabled. Assuming Vip is pulled low, and Vin pulled high, the output impedance of the driver of FIG. 7 Von is given by the sum of the impedances of transistors MP3, MP1 and resistor Rp1. The output impedance at Vop is given by the sum of the impedances R(MN3), R(MN2) of transistors MN3, MN2, respectively and resistor Rn2.

$$R(Von) \text{ when } Vip=0 = R(MP3)+R(MP1)+R(Rp1)$$

$$R(Vop) \text{ when } Vin=V_{DD} = R(MN3)+R(MN2)+R(Rn2)$$

Transistors MP3 and MP1 are sized such that their impedances, R(MP3), R(MP1), when combined, are less than 10% of R(Von). This provides a relatively small voltage drop across the transistors MP3 and MP1, keeping them in a linear region during the time when they are turned on. In the linear region, the transistors behave like a linear resistor. By keeping the transistors MP3 and MP1 in the linear region, R(Von) can be made to be independent of output voltage at Von.

Figure 8:
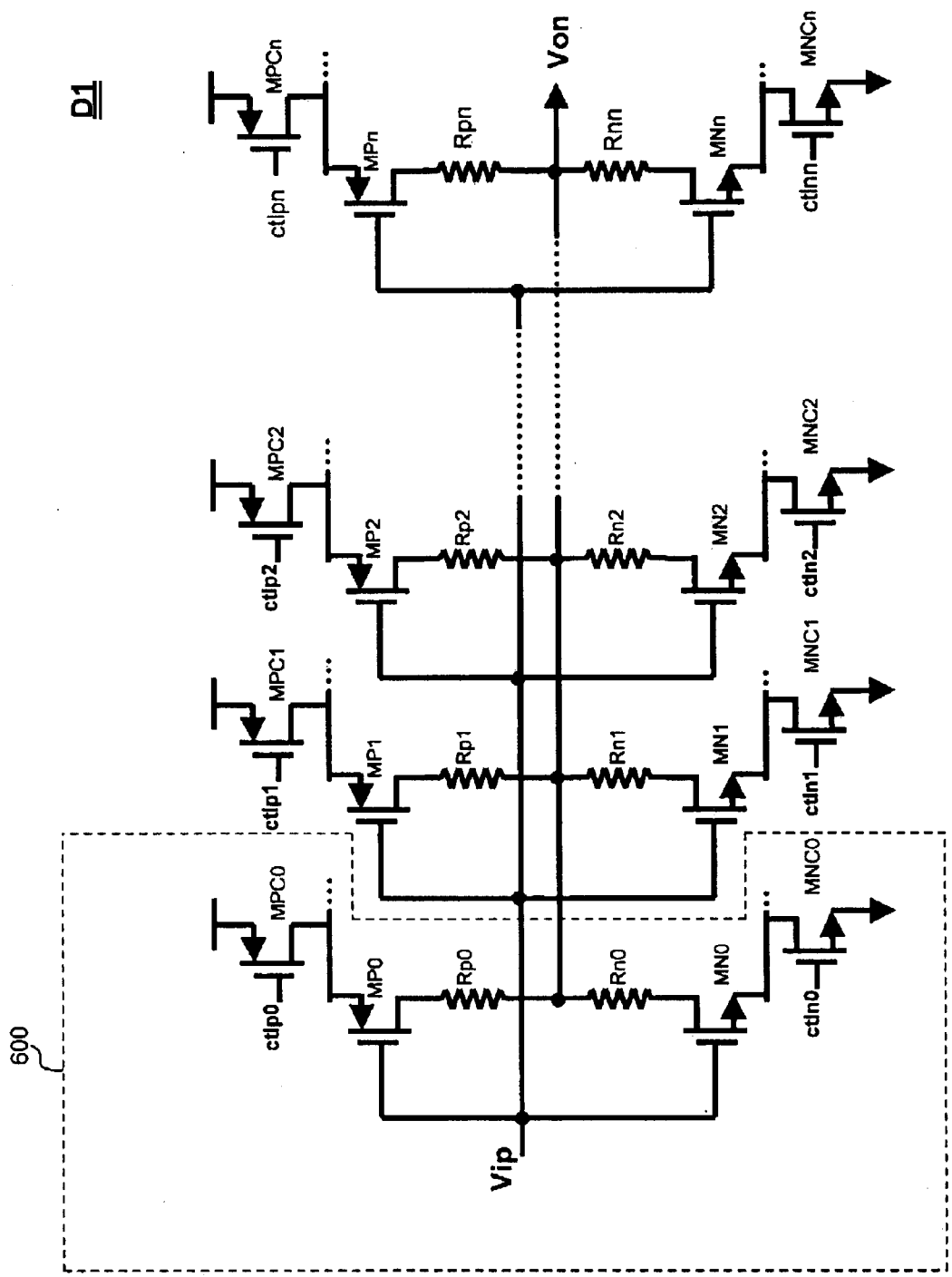
FIG. 8 shows a number of half cells of the present invention arranged in parallel.

FIG. 8 shows the segmented driver D1 in additional detail, showing he overall arrangement of the driver cells 600 of FIG. 6. Note that only one side (the PMOS side) of the segmented driver D1 is shown, to make the diagram simpler. The outputs of all the driver cells 600 are shorted together at Vop, Von, such that the total output impedance of the segmented driver is R(Von)/N, where N is the number of driver cells 600 (assuming all N driver cells 600 are enabled). Note that the input signal Vip is shorted to the input of all driver cells 600, ensuring that each driver cell 600 sees substantially the same input signal and loading conditions.

The segmented driver structure D1 of FIG. 8 is calibrated by connecting it's outputs to an accurate external reference resistor $R_{EXT}$ (see FIG. 7) and placing it in a feedback loop such that the output impedance of the driver D1 will track the impedance of the reference resistor.

The voltages in FIG. 7 are as follows:

$$VR1 = 0.75 \times V_{DD} \qquad \text{Eq. 1}$$

$$VR2 = 0.25 \times V_{DD} \qquad \text{Eq. 2}$$

Assuming the comparator C1 has an infinitely large gain and that the state machine L1 and averaging logic can be modeled as a linear gain block with a gain of 1, and that there are an infinite number of driver cells 600, then:

$$Vop=VR1 \text{ and } Von=VR2 \qquad \text{Eq. 3.}$$

$$Iout(driver) = (Vop-Von)/100 \text{ ohms} = (VR1-VR)/100 \text{ using Eq. 3.} = V_{DD}/200 \text{ using Eqs. 1 and 2.}$$

$$R(Vop) = (V_{DD} \times Vop)/Iout \text{ driver} = (V_{DD} - 0.75 \times V_{DD})/(V_{DD}/200) = 50 \text{ ohms (using Eqs. 1, 2 and 3).}$$

Similarly, $R(Von) = Von/Iout = VR2/(V_{DD}/200) = 0.25 \times V_{DD}/(V_{DD}/200) = 50$ ohms.

In an actual implementation, assuming a finite number of driver cells 600 are used, then the accuracy of the impedance calibration is determined by the number N of driver cells 600 covering an impedance range and by the coupling factor between Von and Vop. The number N of driver cells 600 give the minimum impedance step that the impedance can be calibrated to (in other words the magnitude of the step quantization error):

$$R(Von) = R(Vop \text{ of single driver cell})/N \qquad \text{Eq. 4}$$

where N is the number of driver cells currently switched on.

$$dR(Von)/dN = -R(Vop \text{ of single driver cell})/N^2 \qquad \text{Eq. 5}$$

dR(Von)/dN gives the incremental impedance change due to a incremental change in N. This corresponds to the minimum step accuracy and for a fixed impedance of a single cell 600, this depends on N. For example if R(Vop of single driver cell 600)=1600 ohms, and 32 number of driver cells are switched on, then dR(Von)/dN=−1600/(32²)=1.56 ohms. The impedance step change caused by switching one unit impedance cell is thus 1.56 ohms. The minimum voltage step is 1.56×Iout, where Iout is the current flowing through the driver and is given by $V_{DD}/200$ amps.

Referring again to FIG. 7, there are actually 2 feedback loops operating in the circuit, and they can oppose each other because of coupling between Vop and Von (and vice versa). The first feedback loop tries to force Vop to equal to VR1, and the second loop forces Von to equal VR2. However when Vop changes, Von is affected as well, and vice versa.

When both feedback loops have settled to where Vop is close to VR1 and Von is close to VR2, $Vop=VR1\pm$minimum voltage step$\pm\Delta Von\times K$ $Von=VR2\pm$minimum voltage step$\pm\Delta Vop\times K$ where K is the coupling coefficient, $\Delta$Von represents an incremental change in Von, and $\Delta$Vop represents an incremental change in Vop.

It can be shown that so long as K<1, then both loops will settle and converge to give Vop approximately equal to VR1 and Von approximately equal to VR2. In one embodiment, the K factor is given by the resistor voltage division ratio and is calculated to be ⅓ for R1=R3 and R2=2×R1.

The impedance error can be calculated as follows:

$Rerr=dR(Von)/dN+K*dR(Von)/dN$     Eq. 6 where dR(Von)/dN is the minimum impedance step change or incremental impedance change caused by switching on or off one driver cell.

Using Eq. 5 and Eq. 6, this is given as:

$Rerr=1.333\times R(Vop$ of single driver cell$)/N^2$

The following is an algorithm description of the state machine and averaging logic as implemented in L1 and L2 of FIG. 7. Referring to FIG. 9 and FIG. 7, the algorithm works as follows:

When calibration is first started, a default initial number of driver cells 600 (e.g., N=32) are switched on for both the NMOS and PMOS side of the driver D1. The impedance of the NMOS branch is R(Von)/32 and of the PMOS branch is R(Vop)/32. The comparators C1 and C2 then compare Vop with VR1 and Von with VR2, respectively. If Vop is greater than VR2, this corresponds to R(Von) being greater than the required impedance value. This algorithm will increase the number of turned on NMOS branches in driver cells 600. The number of cells 600 turned on for the NMOS branch, referred to as Nn here, is stored in a register. This process of comparing and incrementing or decrementing Nn value is repeated another seven times, with each Nn value summed or accumulated with the previous Nn values. This is denoted as steps 4 to 6 in FIG. 9. When this process has been repeated more than three times (step 9), then each averaged Nn value is compared with its previous averaged Nn value. If they are equal, this means that the average of the current eight Nn values and the average of the previous eight Nn values are equal, and therefore the impedance value has converged to a stable value. The algorithm then outputs the corresponding averaged Nn value to set the impedance of the driver. Exactly the same process occurs for the PMOS branch. When both NMOS and PMOS branches have converged to their respective impedance values, the calibration clock is stopped and the logic signals that calibration has completed.

The proposed calibration circuitry has a number of advantages over conventional art. It is much more area efficient compared to the conventional art circuit as shown in FIG. 5 due to the following reasons:

Matched current sources 501 and 502 of FIG. 5 are not needed and this saves significant area because these current sources that are connected directly to or indirectly through the PMOS branch to a bonding pad, require special layout rules for ESD protection. This would typically increase the area required for the current sources to 5 to 10 times their normal area. In addition, only one external reference resistor is needed to calibrate both NMOS and PMOS branches for the invention compared to two resistors required for the prior art of FIG. 5. The calibration circuit proposed by Gabara et al. uses only one reference resistor as well, but introduces an additional calibrated NMOS branch (i.e., bottom half of driver) to act as a reference resistor to calibrate the PMOS branch (i.e., upper half of driver). The present invention does not raquire an additional reference resistor nor an additional NMOS or PMOS branch, and hence results in smaller area. The proposed driver can be used as a replica for calibration "as is."

The calibration circuit described herein also is more current efficient than the implementation as shown in FIG. 5 and as described in Gabara et al. and Daily et al. This is due to the fact that the reference resistor is configured as the actual resistance load of the output driver. This enables the current that flows through the driver to flow through the reference resistor as well, unlike the conventional circuit of FIG. 5, which requires additional current to flow through the external reference resistor to generate a reference voltage. In addition, two reference voltage generators and four times the amount of current is needed to calibrate the upper and bottom half of the driver for the scheme described in Gabara et al. This is assuming a calibrated impedance of 50 ohms, that the branch with the lower half and 50 ohm reference resistor takes $V_{DD}/100$ amps, and that the branch with the upper and lower half takes $V_{DD}/100$ as well. The embodiment of the present invention described above takes $V_{DD}/200$, which is four times more current efficient. Also, assuming the calibrated impedance is 50 ohms, the scheme, as described in Gabara et al., will consume a total of 4× more current since the total current used in the two branches is $2\times V_{DD}/(2\times50)$. The present invention only requires $V_{DD}/(4\times50)$ amps.

The driver cell structure 600 of the present invention also has a number of advantages over conventional art. Conventional inverter drivers share the same signal and control path. In the present invention, the signal path and the control path are separated, allowing the removal of any control logic from the signal path. This improves signal delay and slope variation at the input of different driver cells, and also at the input of the NMOS and PMOS switches.

Furthermore, the transient shoot through current is reduced compared to the conventional inverter type series termination type drivers. This is due to the fact that the termination resistors are in series with the transistor switches. Therefore when both PMOS and NMOS switches are on, the transient shoot through current, which is given by $V_{DD}$ divided by a larger resistance, is reduced.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors, executing appropriate software and the like or any combination thereof. Thus, the breadth and scope of the present invention should not be limited by any of the above-described exemplary embodiments, but should be defined only in accordance with the following claims and their equivalents.

What is claimed is:

1. A differential line driver comprising:
    a plurality of driver cells having a common input Vip and a common input Vin, and a common output Vop and a common output Von for driving a line; and
    control logic that generates positive and negative control signals for the driver cells so as to match a combined output impedance of the driver cells at (Vop, Von) to the line,
    wherein each driver cell includes:
        a first PMOS transistor and a first NMOS transistor having gates driven by the input Vip;
        a second PMOS transistor and a second NMOS transistor having gates driven by the input Vin, wherein a source of the first PMOS transistor is connected to a source of the second PMOS transistor, and wherein a source of the first NMOS transistor is connected to a source of the second NMOS transistor;
        first and second resistors connected in series between the first PMOS transistor and the first NMOS transistor, and connected together at the output Von;
        third and fourth resistors connected in series between the second PMOS transistor and the second NMOS transistor, and connected together at the output Vop;
        a first output switch driven by a corresponding positive control signal and connected between a supply voltage and the sources of the first and second PMOS transistors; and
        a second output switch driven by a corresponding negative control signal and connected between a ground and the sources of the first and second PMOS transistors.

2. The differential line driver of claim 1, further comprising an external resistor connected between the outputs Vop and Von.

3. The differential line driver of claim 1, wherein the control logic includes a state machine.

4. The differential line driver of claim 1, further including a first feedback loop connecting the output Vop and the control logic.

5. The differential line driver of claim 4, further including a second feedback loop connecting the output Von and the control logic.

6. The differential line driver of claim 5, further including a reference ladder with reference voltages outputted to the first and second feedback loops for use in generating the positive and negative control signals.

7. The differential line driver of claim 6, wherein the first feedback loop includes a comparator that compares a voltage at the output Vop with a reference voltage from the reference ladder, and wherein the state machine outputs positive control signals based on the comparison.

8. The differential line driver of claim 6, wherein the second feedback loop includes a comparator that compares a voltage at the output Von with a reference voltage from the reference ladder, and wherein the state machine outputs negative control signals based on the comparison.

9. The differential line driver of claim 1, wherein a signal path for the inputs Vip and Vin is different from a signal path for the positive and negative control signals.

10. A differential line driver comprising:
    a plurality of driver cells having a common positive input and negative input, and a common positive output and negative output; and
    a feedback loop for controlling the driver cells with selective positive and negative control signals to selected driver cells so as to match a combined output impedance of the driver cells, each driver cell comprising:
        a first PMOS transistor and a first NMOS transistor having gates driven by the positive input;
        a second PMOS transistor and a second NMOS transistor having gates driven by the negative input, wherein a source of the first PMOS transistor is connected to a source of the second PMOS transistor, and wherein a source of the first NMOS transistor is connected to a source of the second NMOS transistor;
        first and second resistors connected in series between the first PMOS transistor and the first NMOS transistor, and connected together at the negative output;
        third and fourth resistors connected in series between the second PMOS transistor and the second NMOS transistor, and connected together at the positive output;
        a first output switch driven by a corresponding positive control signal and connected between a supply voltage and the sources of the first and second PMOS transistors; and
        a second output switch driven by a corresponding negative control signal and connected between a ground and the sources of the first and second PMOS transistors.

11. The differential line driver of claim 10, further comprising an external resistor connected between the positive output and the negative output.

12. The differential line driver of claim 10, further comprising a state machine that generates the positive and negative control signals for the driver cells so as to match a combined output impedance of the driver cells at (Vop, Von) to the line.

13. The differential line driver of claim 10, further including a reference ladder with reference voltages outputted to the feedback loop for use in generating the positive and negative control signals.

14. The differential line driver of claim 13, wherein the feedback loop includes comparators that compare voltages at the positive and negative output with reference voltages, and generates the positive and negative control signals based on the comparison.

15. The differential line driver of claim 10, wherein a signal path for the positive and negative inputs is different from a signal path for the positive and negative control signals.

16. A differential line driver comprising:
    a first plurality of parallel driver circuits receiving a positive input and outputting a negative output, each driver circuit comprising, in series between a supply voltage and a ground:
a first switch driven by a corresponding positive control signal,
a first PMOS transistor whose gate is driven by the positive input,
a first resistor,
a second resistor,
a first NMOS transistor whose gate is driven by the positive input, and
a second switch driven by a corresponding negative control signal,
wherein the negative output is tapped between the first and second resistors;
a second plurality of parallel driver circuits receiving a negative input and outputting a positive output, each driver circuit comprising, in series between the first switch and the second switch:
a second PMOS transistor whose gate is driven by the negative input,
a third resistor,
a fourth resistor, and
a second NMOS transistor whose gate is driven by the negative input,
wherein the positive output is tapped between the third and fourth resistors; and
control logic that generates the positive and negative control signals so as to control a combined output impedance of the differential line driver.

17. The differential line driver of claim 16, further comprising an external resistor connected between the positive output and the negative output.

18. The differential line driver of claim 16, wherein the control logic includes a state machine.

19. The differential line driver of claim 16, further including a first feedback loop connecting the positive output and the control logic.

20. The differential line driver of claim 19, further including a second feedback loop connecting the negative output and the control logic.

21. The differential line driver of claim 20, further including a reference ladder with reference voltages outputted to the first and second feedback loops.

22. The differential line driver of claim 21, wherein the first feedback loop includes a comparator that compares a voltage at the positive output with a reference voltage from the reference ladder, and wherein the state machine outputs the positive control signals based on the comparison.

23. The differential line driver of claim 21, wherein the second feedback loop includes a comparator that compares a voltage at the negative output with a reference voltage from the reference ladder, and wherein the state machine outputs the negative control signals based on the comparison.

24. The differential line driver of claim 16, wherein a signal path for positive input and the negative input is different from a signal path for the positive and negative control signals.

25. A differential line driver comprising:
a plurality of driver cells having a common input Vip and a common input Vin, and a common output Vop and a common output Von for driving a line; and
control logic that generates positive and negative control signals for the driver cells so as to match a combined output impedance of the driver cells at (Vop, Von) to the line,
wherein a signal path for the common inputs Vip, Vin is different from a signal path for the positive and negative control signals, and
wherein each driver cell comprises:
a first PMOS transistor and a first NMOS transistor having gates driven by the input Vip;
a second PMOS transistor and a second NMOS transistor having gates driven by the input Vin, wherein a source of the first PMOS transistor is connected to a source of the second PMOS transistor, and wherein a source of the first NMOS transistor is connected to a source of the second NMOS transistor;
first and second resistors connected in series between the first PMOS transistor and the first NMOS transistor, and connected together at the output Von;
third and fourth resistors connected in series between the second PMOS transistor and the second NMOS transistor, and connected together at the output Von;
a first output switch driven by a corresponding positive control signal and connected between a supply voltage and the sources of the first and second PMOS transistors; and
a second output switch driven by a corresponding negative control signal and connected between a ground and the sources of the first and second PMOS transistors.

26. A differential line driver comprising:
a first plurality of parallel driver circuits receiving a positive and a negative input and outputting a negative output, each driver circuit comprising, in series between supply and ground voltage:
a first enable switch driven by a corresponding positive control signal,
a first signal switch whose switching terminal is driven by a complement of the positive input,
a first resistor,
a second resistor,
a second signal switch whose switching terminal is driven by the positive input,
a second enable switch driven by a corresponding negative control signal,
wherein the negative output is tapped between the first and second resistors;
a second plurality of parallel driver circuits receiving the negative and positive inputs and outputting a positive output, each driver circuit comprising, in series between the first and the second switch:
a third signal switch whose switching terminal is driven by a complement of the negative input,
a third resistor,
a fourth resistor, and
a fourth signal switch whose switching terminal is driven by the negative input,
wherein the positive output is tapped between the third and fourth resistors; and
control logic that generates the positive and negative control signals so as to control a combined output impedance of the differential line driver.

* * * * *